(12) United States Patent
Furukawa et al.

(10) Patent No.: US 8,854,166 B2
(45) Date of Patent: Oct. 7, 2014

(54) INPUT DEVICE

(75) Inventors: Kenichi Furukawa, Tokyo (JP);
Takayuki Numakunai, Tokyo (JP);
Kensuke Yamada, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/443,116

(22) Filed: Apr. 10, 2012

(65) Prior Publication Data

US 2012/0262263 A1 Oct. 18, 2012

(30) Foreign Application Priority Data

Apr. 12, 2011 (JP) ................. 2011-088352

(51) Int. Cl.
| | | |
|---|---|---|
| H01F 21/02 | (2006.01) | |
| H01H 17/04 | (2006.01) | |
| H01H 35/34 | (2006.01) | |
| G01B 7/16 | (2006.01) | |
| G01D 5/20 | (2006.01) | |
| H03K 17/97 | (2006.01) | |

(52) U.S. Cl.
CPC .............. *G01D 5/2013* (2013.01); *H03K 17/97* (2013.01)
USPC ............... 336/30; 336/221; 200/83 R; 73/779

(58) Field of Classification Search
CPC ..... H01F 5/003; H01F 5/006; H01F 17/0006; H01F 5/06; H01L 2224/48091; H01L 2274/4821; H01L 2224/97; H01L 24/97; H01I 2224/48221; H01I 224/97; H01I 24/49; H05K 9/0022; H05K 1/141; H05K 1/181; H05K 9/002; H01H 13/705; H01H 25/041; H01H 2215/05; H01H 2239/024
USPC ......... 336/30, 221; 200/5 A, 5 R, 83 R, 83 A, 200/83 L, 83 N, 83 Z; 73/152.51, 722, 728, 73/753, 779
See application file for complete search history.

(56) References Cited

U.S. PATENT DOCUMENTS

| | | | | |
|---|---|---|---|---|
| 4,662,226 | A * | 5/1987 | Wang .............................. | 73/728 |
| 5,279,163 | A * | 1/1994 | D'Antonio et al. ............. | 73/728 |
| 5,303,595 | A * | 4/1994 | Shoji et al. ...................... | 73/728 |
| 5,321,300 | A * | 6/1994 | Usuda et al. ................... | 257/529 |
| 5,321,380 | A * | 6/1994 | Godek et al. .................. | 336/232 |
| 5,349,868 | A * | 9/1994 | Shoji et al. ...................... | 73/728 |
| 5,355,714 | A * | 10/1994 | Suzuki et al. ................. | 73/146.5 |
| 5,490,424 | A * | 2/1996 | Shoji et al. ...................... | 73/728 |
| 6,633,220 | B2 * | 10/2003 | Inoue et al. .................... | 336/200 |
| 8,237,314 | B2 * | 8/2012 | Lee et al. ......................... | 310/15 |
| 2012/0072150 | A1 | 3/2012 | Furukawa et al. | |

FOREIGN PATENT DOCUMENTS

JP 2011-003536 1/2011

* cited by examiner

*Primary Examiner* — Alexander Talpalatski
*Assistant Examiner* — Joselito Baisa
(74) *Attorney, Agent, or Firm* — IPUSA, PLLC (57) ABSTRACT

An input device includes a first yoke; a substrate disposed on the first yoke; a coil disposed on the substrate; and a second yoke disposed above the coil and configured to be displaced downward by a force applied and thereby to change inductance of the coil. The input device is configured to output a signal corresponding to the amount of displacement of the second yoke. The substrate has an opening that communicates with a hollow of the coil, and the first yoke includes a step that is inserted into the opening of the substrate.

7 Claims, 7 Drawing Sheets

INPUT DEVICE

CROSS-REFERENCE TO RELATED APPLICATION

The present application is based upon and claims the benefit of priority of Japanese Patent Application No. 2011-088352, filed on Apr. 12, 2011, the entire contents of which are incorporated herein by reference.

BACKGROUND OF THE INVENTION

1. Field of the Invention

An aspect of this disclosure relates to an input device.

2. Description of the Related Art Japanese Patent Application Publication No. 2011-003536, for example, discloses an input device that detects the amount of displacement of a yoke (i.e., the amount of input operation) based on a change in the inductance of a coil which is caused when the yoke is displaced by an input operation.

Here, to improve the accuracy in detecting the amount of displacement of the yoke in such an input device without changing the characteristics of the coil itself, it is preferable to increase the inductance of the coil by increasing the permeability around the coil. However, with the configurations of related-art input devices, it is not possible to generate a sufficiently large inductance.

SUMMARY OF THE INVENTION

In an aspect of this disclosure, there is provided an input device that includes a first yoke; a substrate disposed on the first yoke; a coil disposed on the substrate; and a second yoke disposed above the coil and configured to be displaced downward by a force applied and thereby to change inductance of the coil. The input device is configured to output a signal corresponding to the amount of displacement of the second yoke. The substrate has an opening that communicates with a hollow of the coil, and the first yoke includes a step that is inserted into the opening of the substrate.

DESCRIPTION OF THE PREFERRED EMBODIMENTS

Preferred embodiments of the present invention are described below with reference to the accompanying drawings. An aspect of this disclosure provides an input device or a user interface that receives a force applied, for example, by a finger of an operator and outputs a signal that changes depending on the received force. The output signal is used to detect an input operation performed by the operator. For example, a computer connected to the input device can detect an input operation based on the output signal.

The input device may be used, for example, for electronic devices such as a game console, a remote controller for a television, mobile terminals including a cell phone and a music player, and a personal computer. For example, the operator can move an object (e.g., a cursor, a pointer, or a character) displayed on a display of an electronic device by using the input device. Also, the operator can perform an input operation using the input device to execute a desired function of an electronic device.

Inductance L of an inductor or a coil is obtained by the following formula where K indicates a coefficient, μ indicates permeability, n indicates the number of turns of the coil, S indicates the cross-sectional area of the coil, and d indicates the length of the flux path of the coil:

$$L = K \mu n^2 S / d$$

As is apparent from this formula, when parameters such as the number of turns and the cross-sectional area related to the shape of a coil are fixed, the inductance L can be changed by changing one or both of the permeability around the coil and the length of the flux path.

An exemplary input device that detects an input operation based on a change in the inductance of a coil is described below. The input device receives a force applied by the user from the +Z direction in an orthogonal coordinate system defined by X, Y, and Z axes. The input device includes a displacement part. The position of the displacement part with respect to a coil changes when an input operation is performed on the input device (i.e., when a force is applied to the input device), and as a result the inductance of the coil changes. The input device detects the movement (or displacement) of the displacement part caused by the input operation based on a signal that changes depending on the magnitude of the inductance, and thereby detects the input operation.

Figure 1:
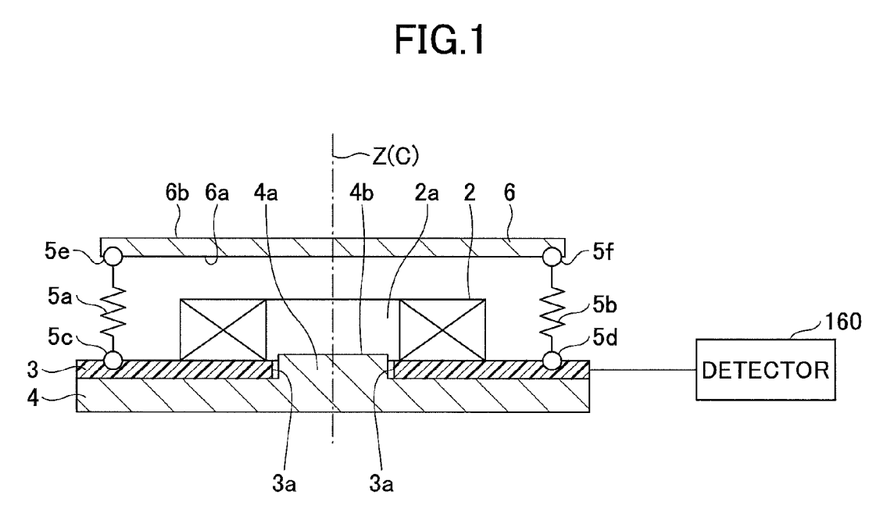
FIG. 1 is a drawing illustrating an exemplary configuration of an input device according to an embodiment.

FIG. 1 is a cut-away side view illustrating an exemplary configuration of an input device according to an embodiment. In FIG. 1, it is assumed that force is not being applied to the input device.

The input device may include a coil 2, a substrate 3, a lower yoke 4, an upper yoke 6, and a detector 160.

The lower yoke 4 is shaped like a plate and made of a magnetic material. The lower yoke 4 has a step (or protrusion) 4a that is inserted into an opening 3a formed in the substrate 3.

The substrate 3 is shaped like a plate and fixed to the upper surface of the lower yoke 4. The coil 2 is placed on the upper surface of the substrate 3. The coil 2 has a hollow 2a that communicates with the opening 3a of the substrate 3. The substrate 3 preferably includes a land pattern that is conductively connected to the ends of a wire forming the coil 2. Such a land pattern makes it easier to mount the coil 2 on the substrate 3.

The coil 2 is fixed to the upper surface of the substrate 3, and is formed by winding a wire (or a conductor) into a cylindrical shape. The coil 2 may also have a tube-like shape other than a cylindrical shape. For example, the coil 2 may have a shape like a rectangular tube. The inductance of the coil 2 changes according to the distance between the coil 2 and the upper yoke 6. The coil 2 outputs a signal waveform corresponding to the change in the inductance, i.e., corresponding to the amount of displacement of the upper yoke 6.

The upper yoke 6 has a lower surface 6a and an upper surface 6b. When a force is applied directly or indirectly to the upper surface 6b, the upper yoke 6 is displaced downward in a space above the coil 2 and as a result, the inductance of the coil 2 changes. The upper yoke 6 may be referred to as a displacement part. The upper yoke 6 is disposed on a side of the input device to which a force is applied by the operator such that the lower surface 6a faces the upper end face of the coil 2 and the upper surface 6b faces outward. The upper yoke 6 is shaped like a plate and made of a magnetic material. The upper yoke 6 is configured to be displaced in a space above the upper end face of the coil 2 along a central axis C of the hollow 2a of the coil 2.

More specifically, the upper yoke 6 is supported by supports 5a and 5b such that the distance between the lower surface 6a and the upper end face of the coil 2 is changeable along the central axis C. For example, the supports 5a and 5b may be made of springs, rubber, sponge, or air/hydraulic cylinders. Using springs for the supports 5a and 5b makes it possible to reduce the weight of the input device and to simplify the configuration of the input device. Meanwhile, using rubber for the supports 5a and 5b makes it possible to provide insulation. Also, the supports 5a and 5b may be made of a viscous material.

The upper yoke 6 and the lower yoke 4 are preferably made of a material with a relative permeability greater than 1. More preferably, the upper yoke 6 and the lower yoke 4 may be made of a material with a relative permeability greater than or equal to 1.001. For example, steel (relative permeability=5000) may be used for the upper yoke 6 and the lower yoke 4.

The detector 160 electrically detects a change in the inductance of the coil 2 and outputs a detection signal corresponding to a continuously changing amount (i.e., an analog value) of displacement of the upper yoke 6 (in other words, the amount of applied force). The detector 160 may be implemented by a detection circuit mounted on the substrate 3 or another substrate not shown.

For example, the detector 160 may detect a physical quantity that changes in proportion to a change in the inductance of the coil 2 and outputs the detected physical quantity as a value that is equivalent to the amount of displacement of the upper yoke 6. Alternatively, the detector 160 may be configured to detect a physical quantity that changes in proportion to a change in the inductance of the coil 2, calculate the inductance of the coil 2 based on the detected physical quantity, and output the calculated inductance as a value that is equivalent to the amount of displacement of the upper yoke 6. Further, the detector 160 may be configured to calculate the amount of displacement of the upper yoke 6 based on the detected physical quantity or the calculated inductance and output the calculated amount of displacement.

In the present embodiment, the detector 160 supplies a pulse signal to the coil 2, thereby causing the coil 2 to generate a signal waveform that changes according to the magnitude of the inductance of the coil 2, and electrically detects a change in the inductance of the coil 2 based on the generated signal waveform.

Here, as the amount of downward displacement of the upper yoke 6 in a space above the upper end face of the coil 2 increases, the permeability around the coil 2 increases and as a result, the inductance of the coil 2 increases. As the inductance of the coil 2 increases, the amplitude of a pulse voltage waveform generated by the supplied pulse signal at the ends of the coil 2 also increases. Based on this phenomenon, the detector 160 may be configured to detect the amplitude of the pulse voltage waveform as a physical quantity that changes in proportion to a change in the inductance of the coil 2, and output the detected amplitude as a value that is equivalent to the amount of displacement of the upper yoke 6. Alternatively, the detector 160 may be configured to calculate the inductance of the coil 2 based on the detected amplitude, and output the calculated inductance as a value that is equivalent to the amount of displacement of the upper yoke 6.

Also, as the inductance of the coil 2 increases, the slope of the waveform of a pulse current caused to flow through the coil 2 by the supplied pulse signal becomes gentle. Based on this phenomenon, the detector 160 may be configured to detect the slope of the pulse current waveform as a physical quantity that changes in proportion to a change in the inductance of the coil 2, and output the detected slope as a value that is equivalent to the amount of displacement of the upper yoke 6. Alternatively, the detector 160 may be configured to calculate the inductance of the coil 2 based on the detected slope, and output the calculated inductance as a value that is equivalent to the amount of displacement of the upper yoke 6.

As described above, according to the configuration of FIG. 1, the opening 3a, which communicates with the hollow 2a of the coil 2, is formed in the substrate 3, and the step 4a, which is inserted in the opening 3a, is formed on the lower yoke 4. With this configuration, the permeability around the coil 2 is increased by the step 4a of the lower yoke 4. Therefore, compared with a configuration where the step 4a is not formed, the configuration of FIG. 1 makes it possible to easily generate a relatively large inductance with respect to the amount of displacement of the upper yoke 6.

Also, with the step 4a formed on the lower yoke 4, it is possible to easily generate a relatively large inductance with respect to the amount of displacement of the upper yoke 6 without forming a core, which enters the hollow 2a of the coil 2 when the upper yoke 6 is displaced, on the lower surface 6a of the upper yoke 6. Here, adding a core increases the weight of the upper yoke 6 used as a displacement part and may reduce the operability of the input device. Meanwhile, with the configuration of FIG. 1 where the step 4a is formed on the lower yoke 4 whose position is fixed with respect to the coil 4, it is possible to easily generate a relatively large inductance with respect to the amount of displacement of the upper yoke 6 without reducing the operability of the input device.

The step 4a is not necessarily configured to pass completely through the opening 3a. However, the step 4a is preferably configured to pass completely through the opening 3a to generate a relatively large inductance with respect to the amount of displacement of the upper yoke 6. Also, the step 4a is preferably configured such that an upper surface 4b of the step 4a is positioned at a level lower than the level of the upper end face of the coil 2. This configuration makes it possible to easily generate a relatively large inductance with respect to the amount of displacement of the upper yoke 6 while keeping a sufficient space for the upper yoke 6 to be displaced downward.

Next, a more detailed configuration of an input device according to an embodiment is described.

Figure 2:
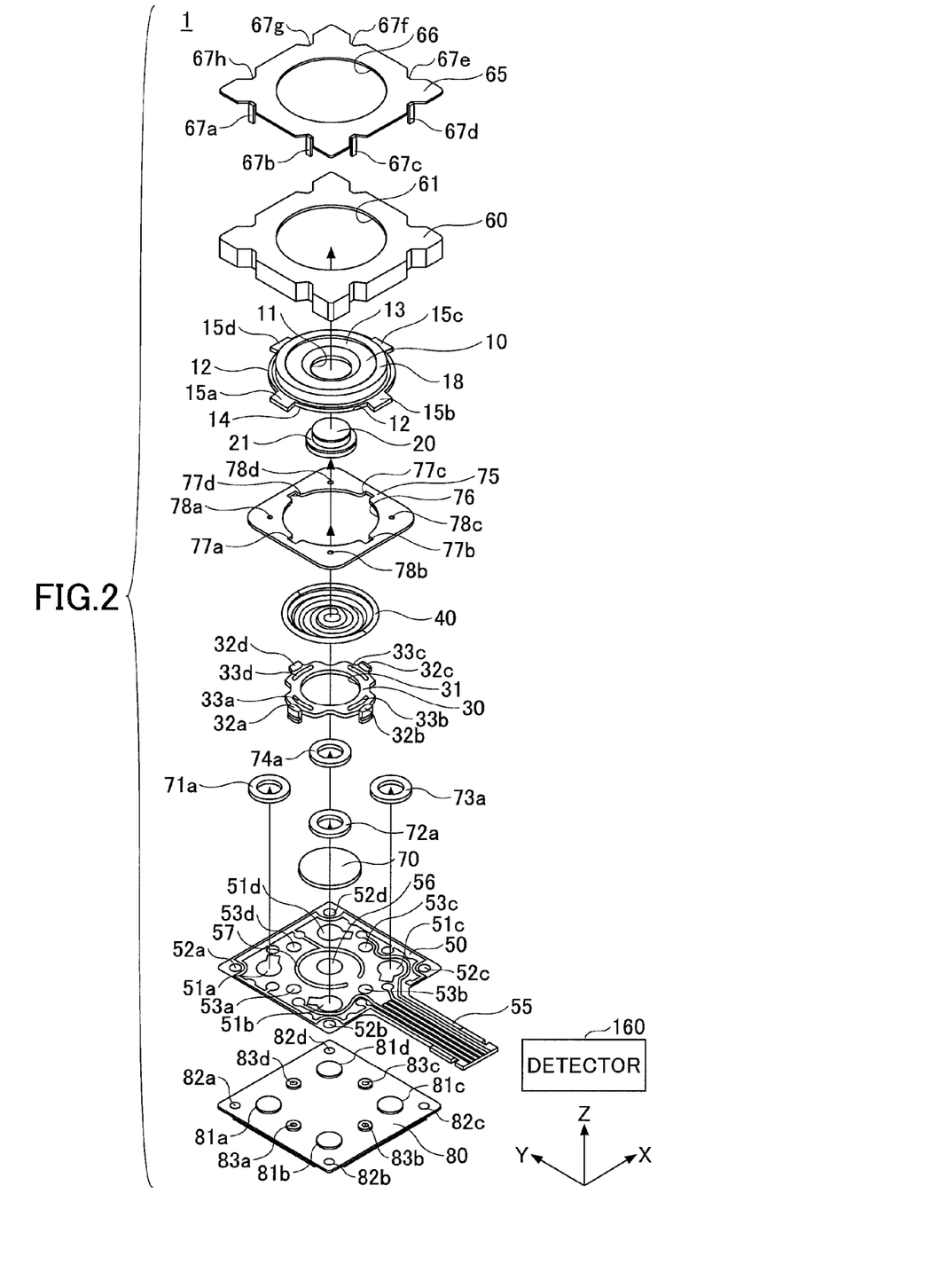
FIG. 2 is an exploded perspective view of an input device of an embodiment.

FIG. 2 is an exploded perspective view of an input device 1 according to an embodiment. The input device 1 may include a substrate 50; coils 71a, 72a, 73a, and 74a fixed to the upper surface of the substrate 50; an upper yoke 75; a lower yoke 80; and a detector 160. The upper yoke 75 and the lower yoke 80 may be made of a material similar to the material of the upper yoke 6 and the lower yoke 4 described above. The substrate 50 has an opening 51a communicating with a hollow of the coil 71a, an opening 51b communicating with a hollow of the coil 72a, an opening 51c communicating with a hollow of the coil 73a, and an opening 51d communicating with a hollow of the coil 74a. The openings 51a through 51d are through holes formed in the substrate 50.

Figure 3:
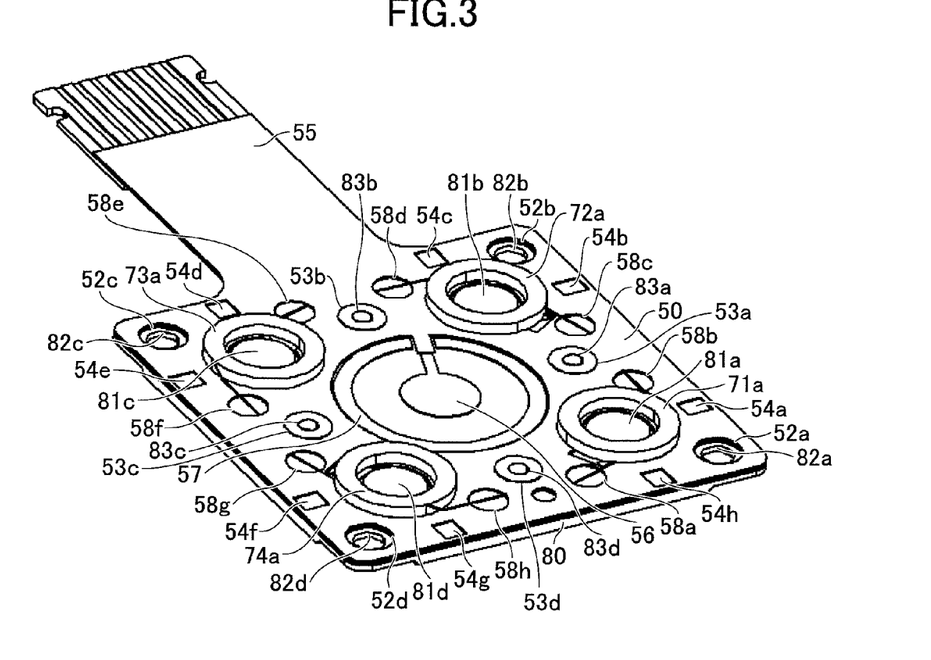
FIG. 3 is a drawing illustrating a lower yoke, a substrate, and coils that are joined together.

FIG. 3 is a drawing illustrating the lower yoke 80, the substrate 50, and the coils 71a, 72a, 73a, and 74a that are joined together. The coils 71a, 72a, 73a, and 74a are fixed to the upper surface of the substrate 50, and the substrate 50 is fixed to the upper surface of the lower yoke 80. Land patterns (or wiring patterns) 58a through 58h are formed on the substrate 50. A terminal of the coil 71a is connected to the land pattern 58a and another terminal of the coil 71a is connected to the land pattern 58b. Similarly, terminals of the coils 72a, 73a, and 74a are connected to the corresponding land patterns 58c through 58h. The terminals of the coils 71a, 72a, 73a, and 74a may be fixed to the land patterns 58a through 58h, for example, by soldering, welding, or bonding with a conductive adhesive. The substrate 50 may be fixed to the lower yoke 80 using, for example, an adhesive tape or an adhesive.

Figure 4:
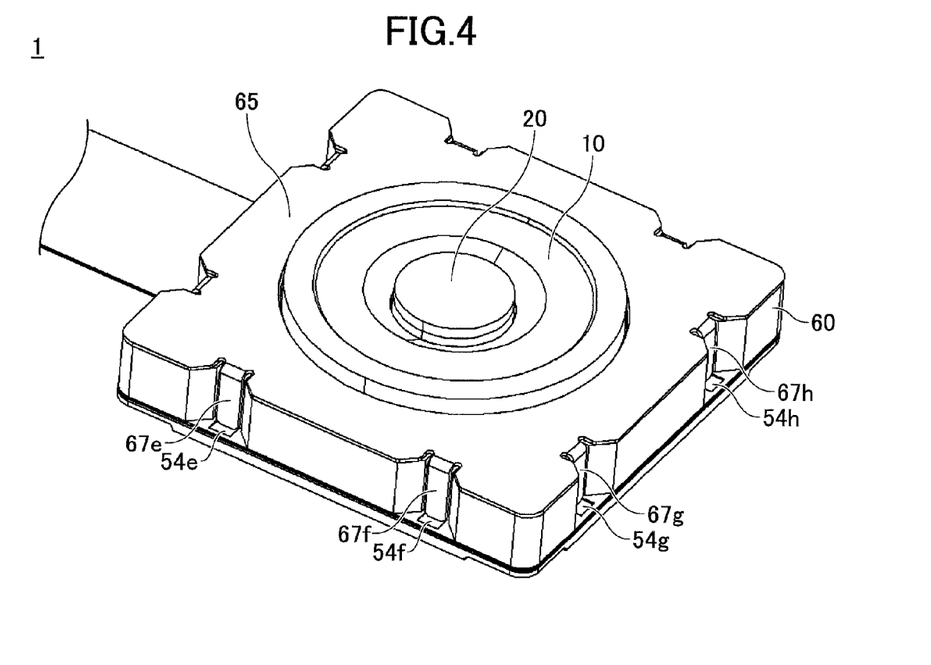
FIG. 4 is a top perspective view of the input device of FIG. 2.
Figure 5:
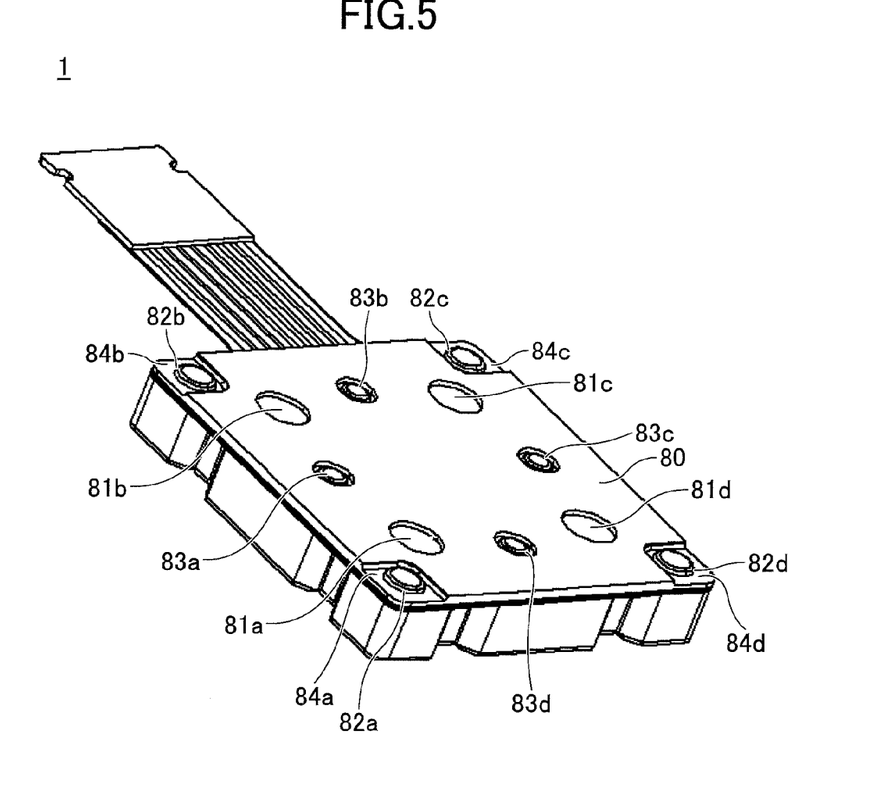
FIG. 5 is a bottom perspective view of the input device of FIG. 2.

FIG. 4 is a top perspective view of the input device 1. FIG. 5 is a bottom perspective view of the input device 1. As illustrated in FIGS. 2 and 5, the lower yoke 80 includes half-blanked parts (or steps) 81a through 81d formed in the lower yoke 80 by half blanking. The half-blanked part 81a is inserted into the opening 51a of the substrate 50, the half-blanked part 81b is inserted into the opening 51b, the half-blanked part 81c is inserted into the opening 51c, and the half-blanked part 81d is inserted into the opening 51d. The half-blanked parts 81a through 81d are recesses in the lower surface of the lower yoke 80 as well as protrusions on the upper surface of the lower yoke 80. Compared with a cutting process, forming steps (or protrusions) to be inserted into the openings 51a through 51d of the substrate 50 by half blanking makes it possible to reduce the processing time.

Figure 6:
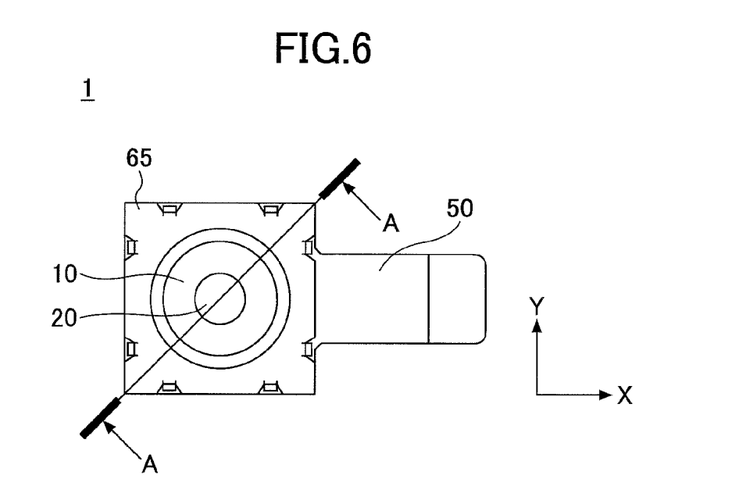
FIG. 6 is a plan view of the input device of FIG. 2.
Figure 7:
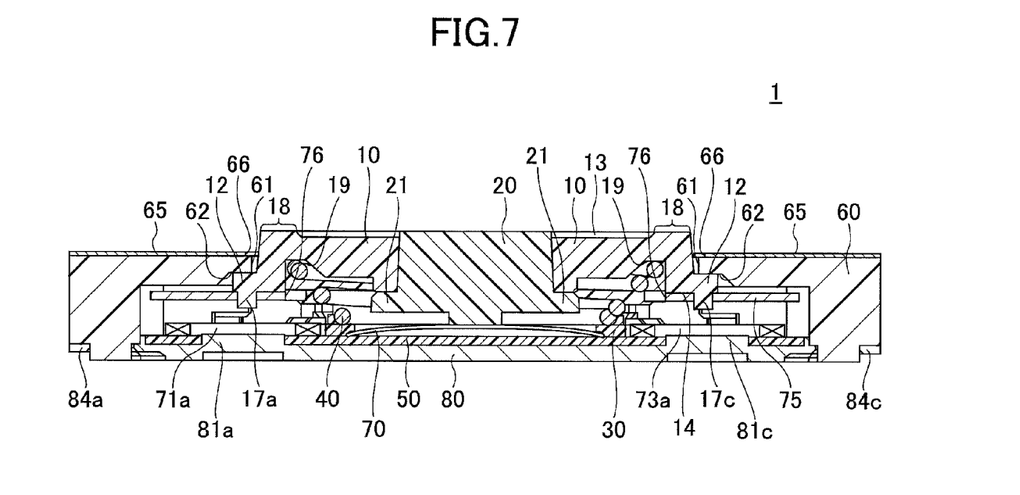
FIG. 7 is a cross-sectional view of the input device taken along line A-A of FIG. 6.

FIG. 6 is a plan view of the input device 1. FIG. 7 is a cross-sectional view of the input device 1 taken along line A-A of FIG. 6. When a force is applied to an operation surface 13 of a direction key 10, the upper yoke 75 is displaced downward in a space above the coils 71a, 72a, 73a, and 74a, and as a result the inductance of the coils 71a, 72a, 73a, and 74a changes.

The direction key 10 is an operating part that is tilted and displaced downward in response to a force applied to the operation surface 13. The upper yoke 75 is disposed below a lower surface 14 of the direction key 10 and is displaced by the displacement of the direction key 10. In this exemplary configuration, bosses 17a through 17d (in FIG. 7, only the bosses 17a and 17c are illustrated) protruding from the lower surface 14 of the direction key 10 are inserted into holes 78a through 78d (see FIG. 2) formed at the corners of the upper yoke 75 to fix the position of the upper yoke 75 on the lower surface 14 of the direction key 10. The direction key 10 or the upper yoke 75 is supported by a return spring 40. Each of the coils 71a, 72a, 73a, and 74a detects the position of the direction key 10 via the upper yoke 75 in a contactless manner, and outputs a signal corresponding to the amount of downward displacement of the direction key 10.

As the amount of downward displacement of the direction key 10 (or the upper yoke 75) increases, the inductance of the coils 71a, 72a, 73a, and 74a increases. The inductance of each of the coils 71a, 72a, 73a, and 74a differs depending on whether the half-blanked parts 81a through 81d are provided. This is described in detail below. Below, for descriptive purposes, the half-blanked parts 81a through 81d are represented by a half-blanked part 81, and the coils 71a, 72a, 73a, and 74a are represented by a coil 71.

Figure 8A:
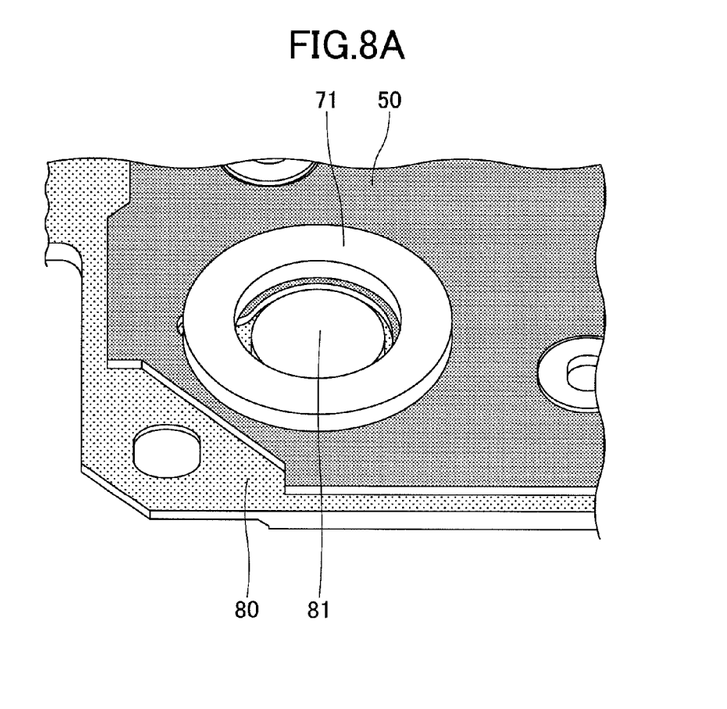
FIG. 8A is a perspective view of a lower yoke where a half-blanked part is formed.
Figure 8B:
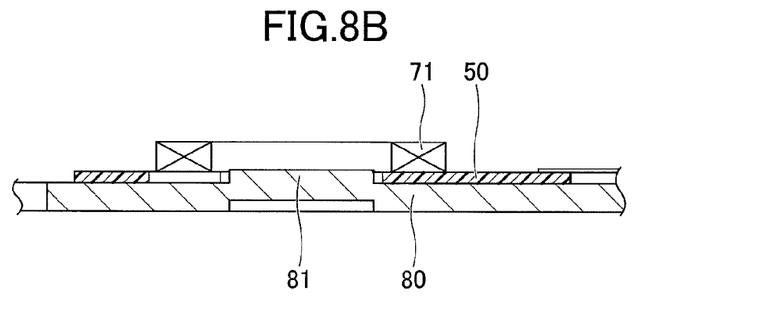
FIG. 8B is a cut-away side view of FIG. 8A.
Figure 9A:
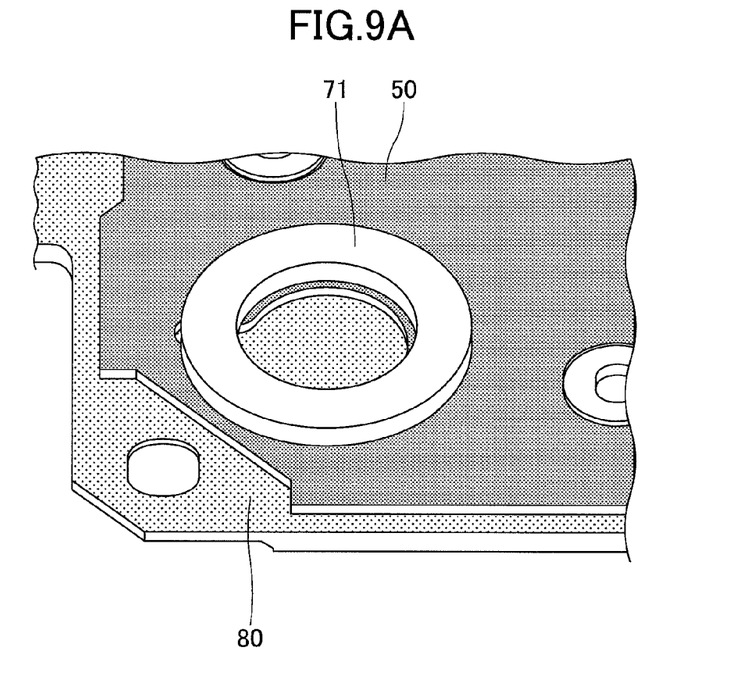
FIG. 9A is a perspective view of a lower yoke where no half-blanked part is formed.
Figure 9B:
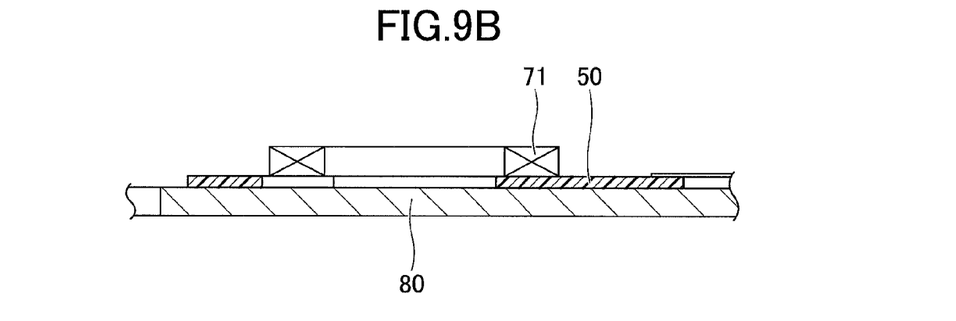
FIG. 9B is a cut-away side view of FIG. 9A.

FIG. 8A is a perspective view of the lower yoke 80 where the half-blanked part 81 is formed. FIG. 8B is a cut-away side view of FIG. 8A. The half-blanked part 81 is positioned to be inserted into the opening (51a, 51b, 51c, 51d) of the substrate 50, and the opening of the substrate 50 is positioned to communicate with the hollow of the coil 71. FIG. 9A is a perspective view of the lower yoke 80 where no half-blanked part is formed. FIG. 9B is a cut-away side view of FIG. 9A. The inductance of the coil 71 was measured for each of the configurations of FIGS. 8A and 8B and FIGS. 9A and 9B while displacing a yoke (e.g., the upper yoke 75) downward to come closer to the coil 71.

Figure 10:
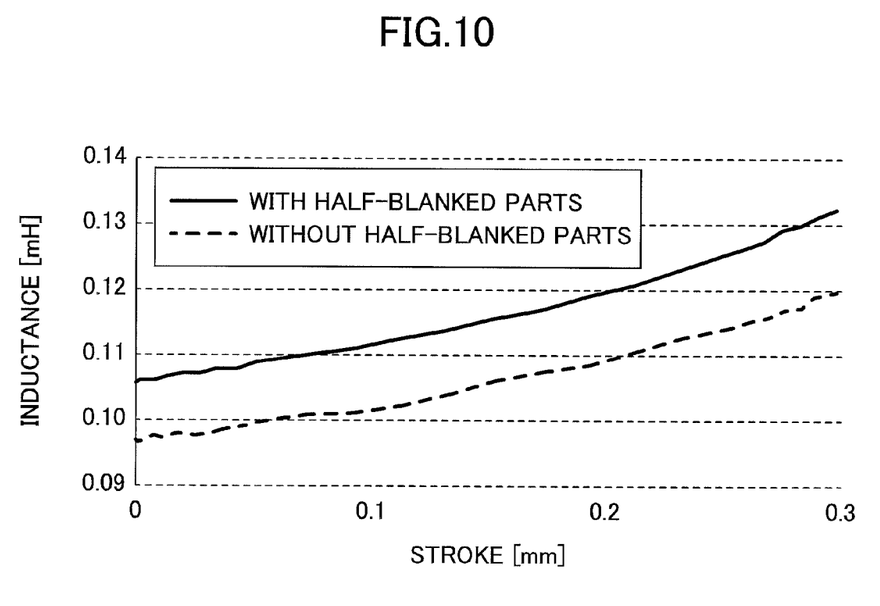
FIG. 10 is a graph illustrating relationships between the amount of stroke of a yoke and the inductance of a coil.

FIG. 10 is a graph illustrating relationships between the amount of stroke of the yoke and the inductance of the coil 71. The horizontal axis in FIG. 10 indicates the amount of stroke that represents the amount of downward displacement of the yoke. When the amount of stroke is 0 mm, there is a maximum distance between the yoke and the coil 71. When the amount of stroke is 0 mm, the inductance of the coil 71 in the configuration with the half-blanked part 81 is 0.106 mH, and the inductance of the coil 71 in the configuration without the half-blanked part 81 is 0.097 mH (indicates an increase rate of 8.9%). When the amount of stroke is 0.3 mm, the inductance of the coil 71 in the configuration with the half-blanked part 81 is 0.132 mH, and the inductance of the coil 71 in the configuration without the half-blanked part 81 is 0.119 mH (indicates an increase rate of 11.2%). Thus, the inductance of the coil 71 is increased by about 10% by providing the half-blanked part 81 at a position corresponding to the hollow of the coil 71.

Also, the positions of the coils 71a, 72a, 73a, and 74a on the substrate 50 are fixed or determined by the half-blanked parts 81a through 81d. Thus, providing the half-blanked parts 81a through 81d also makes it possible to reduce errors in assembling the coils 71a, 72a, 73a, and 74a and the substrate 50. Reducing the assembly errors in turn makes it possible to prevent the variation in inductance between input devices and the deviation of the inductance from a designed value.

Referring back to FIGS. 2 and 3, the substrate 50 includes a connecting part 55 that protrudes outward from the input device 1 (more specifically, from a case of the input device 1). The connecting part 55 includes a wiring pattern for outputting a signal corresponding to the amount of displacement of the upper yoke 75. Providing the connecting part 55 extending from the substrate 50 makes it easier to connect the substrate 50 of the input device 1 to a circuit (e.g., the detector 160) of an external device. For example, the substrate 50 may be connected via the connecting part 55 to a circuit of an electronic device such as a game console where the input device 1 is installed.

The substrate 50 including the connecting part is preferably implemented by a flexible printed circuit board (FPC). Using an FPC makes it possible to increase the flexibility in mounting the input device 1 in a product (external device). For example, since an FPC bends flexibly, the input device 1 using an FPC can be mounted at a desired height in a product. Also, the input device 1 using an FPC can be mounted in products with various heights. However, the substrate 50 is not limited to an FPC. For example, the substrate 50 may be implemented by a resin substrate such as an FR-4 (flame retardant type 4) substrate.

A peripheral electrode 57 and a center electrode 56 are formed on the substrate 50. The peripheral electrode 57 is conductively connected by, for example, soldering to the periphery of a click spring 70. The center electrode 56 contacts a peak of the click spring 70 when the click spring 70 is deformed. The click spring 70 is deformed by a center key 20 provided at the center of the direction key 10. The center key 20 is a type of push button whose top surface is exposed through the operation surface 13 of the direction key 10 and protrudes in the Z-axis direction in FIG. 2. A flange 21 is formed around the center key 20 such that the position of the center key 20 is fixed when the center key 20 is fitted into an opening 11 formed at the center of the direction key 10. When the center key is pressed from above, the click spring 70 on the substrate 50 is deformed downward at its center.

As illustrated in FIGS. 3 and 4, shield lands 54a through 54h are formed on the substrate 50. The shield lands 54a through 54h are used to ground a cover 65 that functions as an electrostatic shield. Pins 67a through 67h formed at the periphery of the cover 65 are connected to the shield lands 54a through 54h using, for example, solder or a conductive adhesive. The pins 67a through 67h discharge static electricity to the shield lands 54a through 54h. Also, the pins 67a through 67h fix the cover 65 to the substrate 50.

Some or all of the shield lands 54a through 54h, the land patterns 58a through 58h, the center electrode 56, and the peripheral electrode 57 may be electrically connected via the connecting part 55 to an external device.

A lower hard stop 30 is a limiting part provided below the direction key 10. Through holes 53a through 53d are formed in the substrate 50 and through holes 83a through 83d are formed in the lower yoke 80 to fix the lower hard stop 30. The lower hard stop 30 includes contact surfaces 32 (32a through 32d). When pressed, a lower surface of the direction key 10 directly below a periphery part 18 of the operation surface 13 contacts the contact surfaces 32. Thus, the lower hard stop 30 prevents the direction key 10 from being displaced downward beyond the contact surfaces 32. In other words, the direction key 10 can be displaced downward until its lower surface contacts the contact surfaces 32.

A case 60 is provided to house the substrate 50, the coils 71a, 72a, 73a, and 74a, and the upper yoke 75. According to an embodiment, as illustrated in FIGS. 2, 3, and 5, through holes 82a, 82b, 82c, and 82d are formed at the corners of the lower yoke 80, and recesses 84a, 84b, 84c, and 84d are formed in the lower surface of the lower yoke 80 around the through holes 82a, 82b, 82c, and 82d. The through holes 82a, 82b, 82c, and 82d and the recesses 84a, 84b, 84c, and 84d are examples of fixing parts (or locating parts) used to fix the case 60. This configuration eliminates the need to provide separate fixing parts to fix the case 60. Protrusions formed on the lower surface of the case 60 are inserted via through holes 52a-52d formed at the corners of the substrate 50 into the through holes 82a-82d, and the tips of the protrusions are welded to the recesses 84a-84d.

Figure 11:
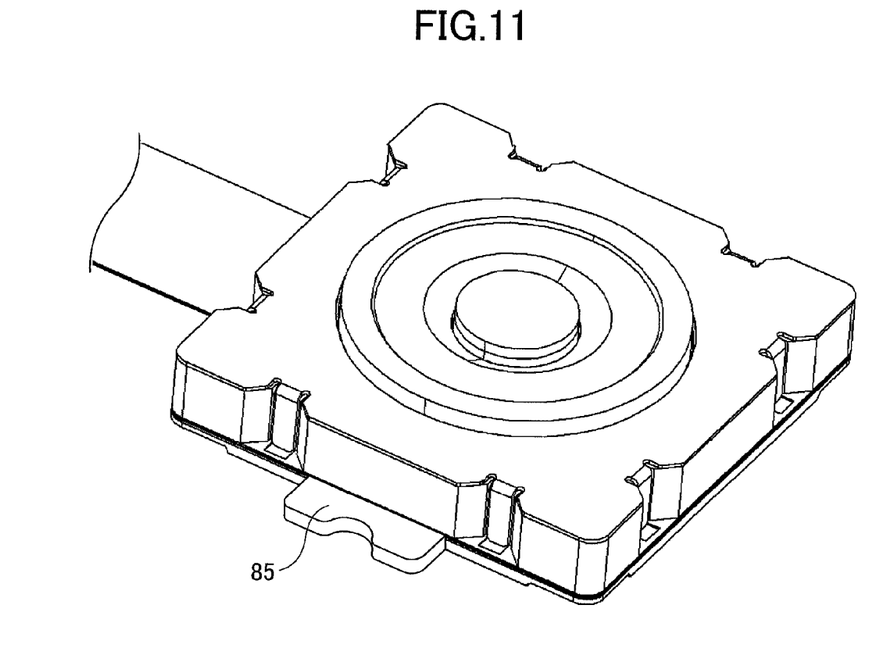
FIG. 11 is a drawing illustrating a bracket.

According to an embodiment, as illustrated in FIG. 11, the lower yoke 80 may include a bracket 85 extending from a side of the lower yoke 80. The bracket 85 is an example of a fixing part (or a locating part) used to fix the input device 1 to, for example, an external device. Forming the bracket 85 as a part of the lower yoke 80 eliminates the need to provide a separate fixing part to fix the input device 1. The lower yoke 80 is made of a material with a strength higher than that of the material of the substrate 50, and is therefore hard to be fractured, cracked, or chipped. Therefore, a part of the lower yoke 80 can be used as the bracket 85 for fixing the input device 1. Also, using the lower yoke 80 as a part of the outer frame of the input device 1 makes it possible to improve the strength of the input device 1.

As described above, an aspect of this disclosure provides an input device that makes it possible to generate a relatively large inductance with respect to the amount of displacement of a yoke.

Preferred embodiments of the present invention are described above. However, the present invention is not limited to the specifically disclosed embodiments, and variations and modifications may be made without departing from the scope of the present invention.

For example, instead of the return spring 40, a support for supporting the direction key 10 or the upper yoke 75 may be implemented by rubber, sponge, or an air/hydraulic cylinder.

An input device according to an embodiment may be configured to be operated using a palm, a toe, or a sole instead of a finger. Also, according to an embodiment, the surface of an input device touched by the operator may be flat, concave, or convex.

What is claimed is:

1. An input device, comprising:
a first yoke;
a plate-shaped substrate disposed on the first yoke;
a coil disposed on the substrate; and
a second yoke disposed above the coil and configured to be displaced downward by a force applied thereto and thereby to change inductance of the coil, wherein
the input device is configured to output a signal corresponding to an amount of displacement of the second yoke;
the substrate has an opening formed therein that is disposed below a hollow of the coil and communicates with the hollow of the coil;
the first yoke includes a step formed thereon that is inserted into the opening of the substrate; and
the step passes completely through the opening of the substrate and is made of a magnetic material, and an upper surface of the step is lower than an upper end face of the coil.

2. The input device as claimed in claim 1, wherein the step is a half-blanked part of the first yoke.

3. The input device as claimed in claim 1, wherein a position of the coil is fixed by the step.

4. The input device as claimed in claim 1, wherein
the substrate includes a connecting part protruding outward from the input device; and
the connecting part includes wiring configured to output the signal corresponding to the amount of displacement of the second yoke.

5. The input device as claimed in claim 4, wherein the connecting part is flexible.

6. The input device as claimed in claim 1, further comprising:
a case configured to house the substrate, the coil, and the second yoke,
wherein the first yoke includes a fixing part formed therein that is configured to fix the case.

7. The input device as claimed in claim 1, wherein a part of the first yoke is formed as a fixing part configured to fix the input device.

* * * * *